(12) United States Patent
Lee et al.

(10) Patent No.: US 9,184,772 B2
(45) Date of Patent: Nov. 10, 2015

(54) ELECTRONIC DEVICES FOR RF FRONT END SIGNAL PROCESSING

(75) Inventors: Hsin-Ying Lee, Kaohsiung (TW); Chi-Sheng Yu, New Taipei (TW); Lien Chien, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 92 days.

(21) Appl. No.: 13/561,596

(22) Filed: Jul. 30, 2012

(65) Prior Publication Data

US 2013/0100623 A1    Apr. 25, 2013

Related U.S. Application Data

(60) Provisional application No. 61/551,033, filed on Oct. 25, 2011.

(51) Int. Cl.
*H05K 7/02* (2006.01)
*H04B 1/00* (2006.01)

(52) U.S. Cl.
CPC .................................. *H04B 1/0057* (2013.01)

(58) Field of Classification Search
CPC ........................................................ H05K 7/02
USPC ............................ 361/679.01, 748, 760, 807
See application file for complete search history.

(56) References Cited

U.S. PATENT DOCUMENTS

| 5,751,557 | A  | * | 5/1998  | Silva ............................. 361/777 |
| 5,915,212 | A  | * | 6/1999  | Przelomiec et al. ............ 455/83 |
| 2006/0293005 | A1 |   | 12/2006 | Hara et al. |
| 2009/0201084 | A1 |   | 8/2009  | See et al. |
| 2010/0291736 | A1 | * | 11/2010 | Hoang et al. ................. 438/107 |

FOREIGN PATENT DOCUMENTS

| CN | 101167256 | 4/2008 |
| CN | 101965682 | 2/2011 |

* cited by examiner

*Primary Examiner* — Jenny L Wagner
*Assistant Examiner* — Michael P McFadden
(74) *Attorney, Agent, or Firm* — McClure, Qualey & Rodack, LLP

(57) ABSTRACT

An electronic device includes a circuit board. The circuit board includes a power amplifier footprint configured for mounting a first power amplifier or a second power amplifier thereon. The power amplifier footprint includes a first part and a second part. The first part includes multiple I/O pads. When the first power amplifier is mounted on the circuit board, the I/O pads in the first part are coupled to the first power amplifier. The second part includes multiple I/O pads. When the second power amplifier is mounted on the circuit board, both the I/O pads in the first part and the I/O pads in the second part are coupled to the second power amplifier.

15 Claims, 6 Drawing Sheets

US 9,184,772 B2

ELECTRONIC DEVICES FOR RF FRONT END SIGNAL PROCESSING

CROSS REFERENCE TO RELATED APPLICATIONS

This application claims the benefit of U.S. Provisional Application No. 61/551,033 filed Oct. 25, 2011 and entitled "UMTS PA co-layout footprint and system architecture using the same". The entire contents of which are hereby incorporated by reference.

BACKGROUND OF THE INVENTION

1. Field of the Invention

The invention relates to a printed circuit board (PCB) layout, and more particularly to a multi-band power amplifier co-layout footprint.

2. Description of the Related Art

A radio-frequency (RF) power amplifier is a type of electronic amplifier used to convert a low-power RF signal into a larger signal of significant power, typically for driving the antenna of a transmitter. It is usually optimized to have high efficiency, high output power compression, good return loss on the input and output, good gain, and optimum heat dissipation.

In the UMTS (Universal Mobile Telecommunications System), there are various UMTS bands deployed over the world. For example, Band I (W-CDMA 2100) is used in Europe, India, Africa, Asia, . . . etc, Band II (W-CDMA 1900) is used in North America and South America, Band IV (W-CDMA 1700 or Advanced Wireless Services) is used in the United States and Canada, Band V (W-CDMA 850) is used in Australia, Hong Kong, Thailand, New Zealand . . . etc, and Band VIII (W-CDMA 900) is used in Europe, Asia, Australia, New Zealand, Thailand . . . etc.

In order to support multi-band operations (for example, up to 4 UMTS bands), designers have to reserve PCB area for multiple power amplifiers, each being configured for amplifying the RF signals for specific UMTS bands. Different types of power amplifiers, such as single band and multi-band power amplifiers, could be mounted on the PCB area depending on system requirements. It is a need to develop a PCB compatible with different types of power amplifiers in a relative small area.

Therefore, a novel PA co-layout footprint and system architecture are required.

BRIEF SUMMARY OF THE INVENTION

Electronic devices suitable for RF front end signal processing are provided. An embodiment of an electronic device comprises a circuit board. The circuit board comprises a power amplifier footprint configured for mounting a first power amplifier or a second power amplifier thereon. The power amplifier footprint comprises a first part and a second part. The first part comprises a plurality of I/O pads. When the first power amplifier is mounted on the circuit board, the I/O pads in the first part are coupled to the first power amplifier. The second part comprises a plurality of I/O pads. When the second power amplifier is mounted on the circuit board, both the I/O pads in the first part and the I/O pads in the second part are coupled to the second power amplifier.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
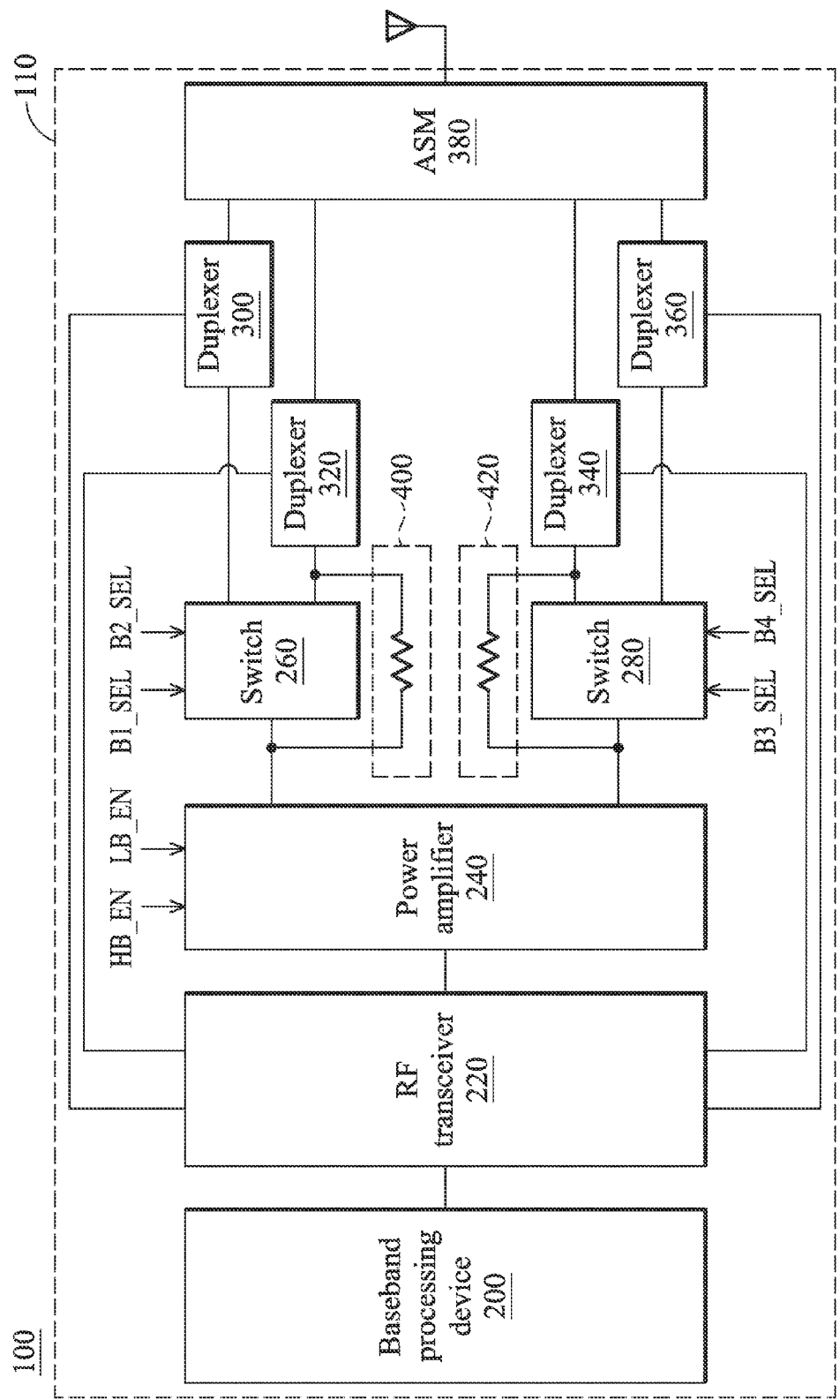
FIG. 1 shows an exemplary block diagram of an electronic device according to an embodiment of the invention.

FIG. 1 shows an exemplary block diagram of an electronic device according to an embodiment of the invention. The electronic device 100 may be a notebook, a cellular phone, a portable gaming device, a flat computer, or others. The electronic device 100 may comprise a circuit board 110 and a plurality of devices mounted on the circuit board 110. According to an embodiment of the invention, the devices mounted on the circuit board 110 may comprise a baseband processing device 200, a RF transceiver 220, a power amplifier 240, one or more switch(es) (depending on how many UMTS bands are implemented, which will be discussed in more detailed in the following paragraphs), one or more duplexer(s) (depending on how many UMTS bands are implemented, which will be discussed in more detailed in the following paragraphs), and an antenna switch module (ASM) 380. In an embodiment of the invention, the baseband processing device, RF transceiver, power amplifier, switch(es), duplexer(s) and ASM may be respectively practiced in an individual hardware device, such as an individual integrated circuit (IC) or a passive component, or others, mounted on the circuit board 110 and coupled to the adjacent devices via one or more traces.

Note that in order to clearly illustrate the concept of the invention, in the embodiment as shown in FIG. 1, the electronic device 100 is designed to be capable of supporting 4 UMTS bands. Therefore, there are two switches 260 and 280 and four duplexers 300, 320, 340 and 380 shown in FIG. 1 and each duplexer is configured for duplexing transmission (TX) and reception (RX) signals for a specific UMTS band. Note that the electronic device may also be designed to be capable of supporting less than 4 or more than 4 UMTS bands by decreasing or increasing the amount of switches, duplexers, band select signals, band enable signals and/or the amount of signal processing branches (which will be discussed in more detailed in the following paragraphs). Therefore, it is to be understood that the invention should not be limited to the structure shown in FIG. 1. To the contrary, it is intended to cover various modifications and similar arrangements as would be apparent to those skilled in the art, and the scope of the appended claims should be accorded the broadest interpretation so as to encompass all such modifications and similar arrangements.

The baseband processing device 200 may comprise multiple hardware devices to perform baseband signal processing, including Analog to Digital Conversion (ADC)/Digital to Analog Conversion (DAC), gain adjusting, modulation/demodulation, encoding/decoding, and so on. For example, the baseband processing device 200 may comprise a processor for performing baseband signal processing, issuing the band select signals and/or band enable signals, and so on. The RF transceiver 220 may, in the RX operation, receive RF signals, convert the received RF signals to baseband signals, which are later processed by the baseband processing device 200, or, in the TX operation, receive baseband signals from the baseband processing device 200 and convert the received baseband signals to RF signals, which are later transmitted. The RF transceiver 220 may also comprise multiple hardware devices to perform signal transceiving and radio frequency conversion. For example, the RF transceiver 220 may comprise a mixer module to multiply the baseband signals with a carrier oscillated in the radio frequency of the wireless communications system, wherein the radio frequency may be 900 MHz, 1900 MHz, 2100 MHz, or others, utilized in Universal Mobile Telecommunications System (UMTS) systems, or may be 900 MHz, 2100 MHz, or 2.6 GHz utilized in the LTE systems, or others depending on the radio access technology (RAT) in use.

According to an embodiment of the invention, the power amplifier, switch(es), duplexer(s) and ASM may be regarded as the RF front end circuit suitable for processing RF front end signals. In the embodiments of the invention, the power amplifier 240 may be implemented as a single band power amplifier or a multi-band power amplifier (which will be discussed in more detailed in the following paragraphs). In order to support multi-band operations, there may be two signal processing branches separated from the output of the power amplifier 240, wherein one is configured for processing high band RF signals and the other is configured for processing low band RF signals. From an aspect of the invention, the term "high band" may refer to the frequency bands higher than a predetermined frequency, and the term "low band" may refer to the frequency bands not higher than the predetermined frequency. For example, the predetermined frequency may be set as 1700 MHz. From another aspect of the invention, the terms "high band" and "low band" may be generic terms representing or encompassing one or more UMTS frequency bands. The UMTS frequency bands are radio frequencies used by UMTS networks. For example, for the commonly used UMTS Band I, Band II and Band IV, may be regarded as the "high band", while the commonly used UMTS Band V and Band VIII, may be regarded as the "low band". Therefore, when the power amplifier 240 is a single band power amplifier, the power amplifier 240 may be a single band power amplifier IC that is suitable for processing only the high band or only the low band signals. On the other hand, when the power amplifier 240 is a multi-band power amplifier, the power amplifier 240 may be a multi-band power amplifier IC that is suitable for processing both the high band and the low band signals. To simplify and unify the illustrations, in the following paragraphs, when the power amplifier 240 is implemented as a single band power amplifier, it is designated to process only the low band signals. However, it should be understood that the power amplifier 240 may also be implemented as a single band power amplifier for processing only the high band signals, and the invention should not be limited thereto.

In the TX operations, the power amplifier 240 may receive a high band enable signal HB_EN or a low band enable signal LB_EN from the baseband processing device 200 so as to enable the corresponding power amplifier circuit configured for amplifying the high band or low band RF signals. In response to the high band enable signal HB_EN, the power amplifier 240 may further pass the amplified high band RF signals to one of the switches, for example, the switch 260. On the other hand, in response to the low band enable signal LB_EN, the power amplifier 240 may further pass the amplified low band RF signals to another switch, for example, the switch 280. The switch 260 may receive at least one band select signal (for example, the band select signal(s) B1_SEL and/or B2_SEL) from the baseband processing device 200 so as to selectively pass the amplified high band RF signals to the duplexer 300 or 320. For example, when the amplified high band RF signals are the UMTS Band I signals, the baseband processing device 200 may issue the band select signal B1_SEL to the switch 260. In response to the band select signal B1_SEL, the switch 260 may pass the amplified high band RF signals to the duplexer 300, which is configured for duplexing transmission (TX) and reception (RX) signals for the UMTS Band I. The switch 280 may also receive at least one band select signal (for example, the band select signal(s) B3_SEL and/or B4_SEL) from the baseband processing device 200 so as to selectively pass the amplified low band RF signals to the duplexer 340 or 360. The amplified high band or low band RF signals may further be transmitted to the ASM 380 from the corresponding duplexer 300, 320, 340 or 360 and finally transmitted to the air interface through the antenna.

In the RX operations, the RF signals received from the antenna for a specific UMTS band may be passed to the corresponding duplexer 300, 320, 340 or 360 via the ASM 380. The duplexer 300, 320, 340 or 360 may then pass the received RF signals to the RF transceiver 220 for frequency down conversion.

Figure 2:
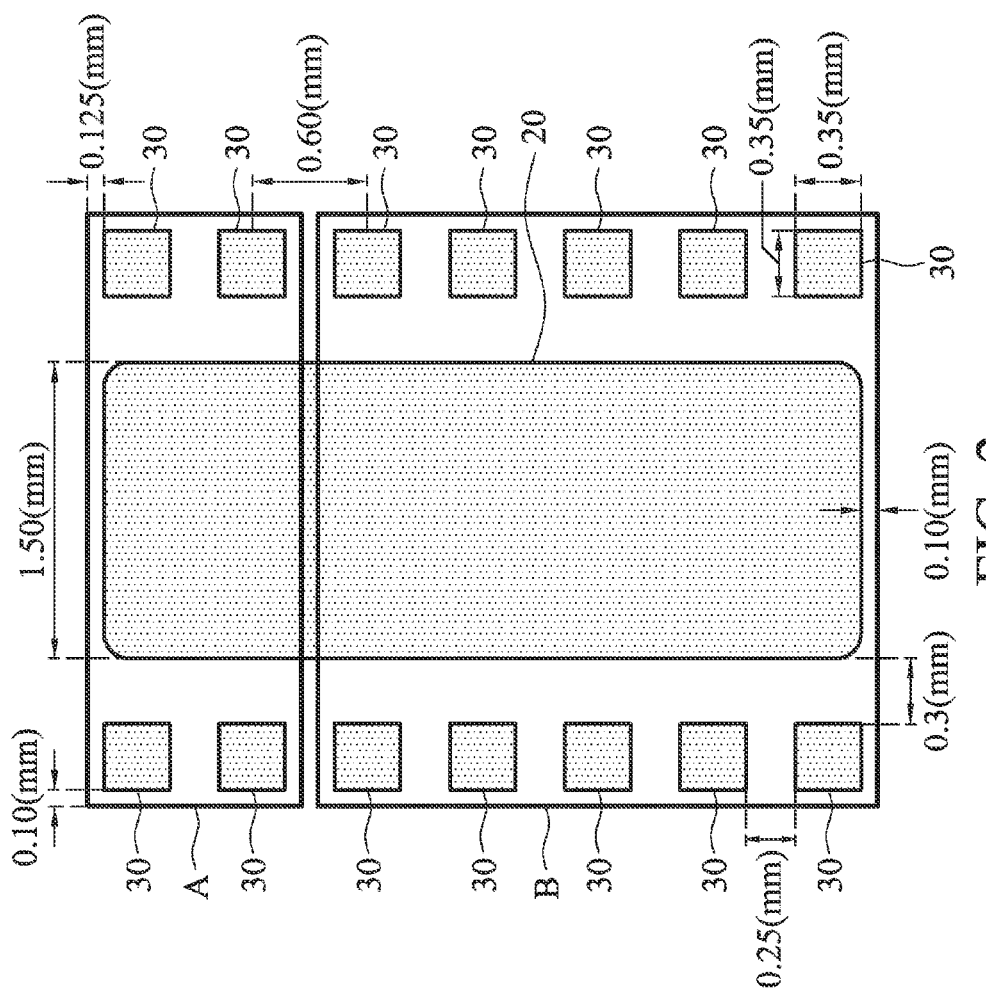
FIG. 2 shows an exemplary power amplifier footprint configured for flexibly mounting different types of power amplifiers thereon according to an embodiment of the invention.

According to an embodiment of the invention, the circuit board 110 may comprise a plurality of component footprints, each being configured for mounting a corresponding device thereon. For example, the power amplifier footprint may be configured for mounting a power amplifier, the switch footprint(s) may be configured for mounting the switch 260 and/or 280, the duplexer footprint(s) may be configured for mounting the duplexers 300, 320, 340 and/or 360, and so on. FIG. 2 shows an exemplary power amplifier footprint configured for mounting a power amplifier according to an embodiment of the invention. The power amplifier footprint may comprise a ground plane 20 and a plurality of I/O pads 30, and is configured for mounting a single band power amplifier or a multi-band power amplifier thereon. The power amplifier footprint may be separated into two parts, as the shown part A and part B. In the embodiment, part B may be regarded as a basic part and configured for mounting the single band power amplifier thereon, while the part A may be regarded as an extended part and, in conjunction with the part B, configured for mounting the multi-band power amplifier thereon. To be more specific, when a single band power amplifier (for example, a low band power amplifier capable of amplifying low band RF signals) is mounted on the circuit board, the I/O pads in part B are utilized and coupled to the corresponding pins of the single band power amplifier. On the other hand, when a multi-band power amplifier (for example, a multi-band power amplifier capable of amplifying both the high band and low band RF signals) is mounted on the circuit board, both the I/O pads in part A and part B are utilized and coupled to the corresponding pins of the multi-band power amplifier. Therefore, the power amplifier footprint as shown in FIG. 2 is a co-layout footprint and configured for flexibly mounting different types of power amplifier thereon, depending on product requirements, which have different number of pins thereon. Note that the numbers shown in FIG. 2 are merely exemplary layout sizes of the power amplifier footprint, and the invention should not be limited thereto.

Figure 3:
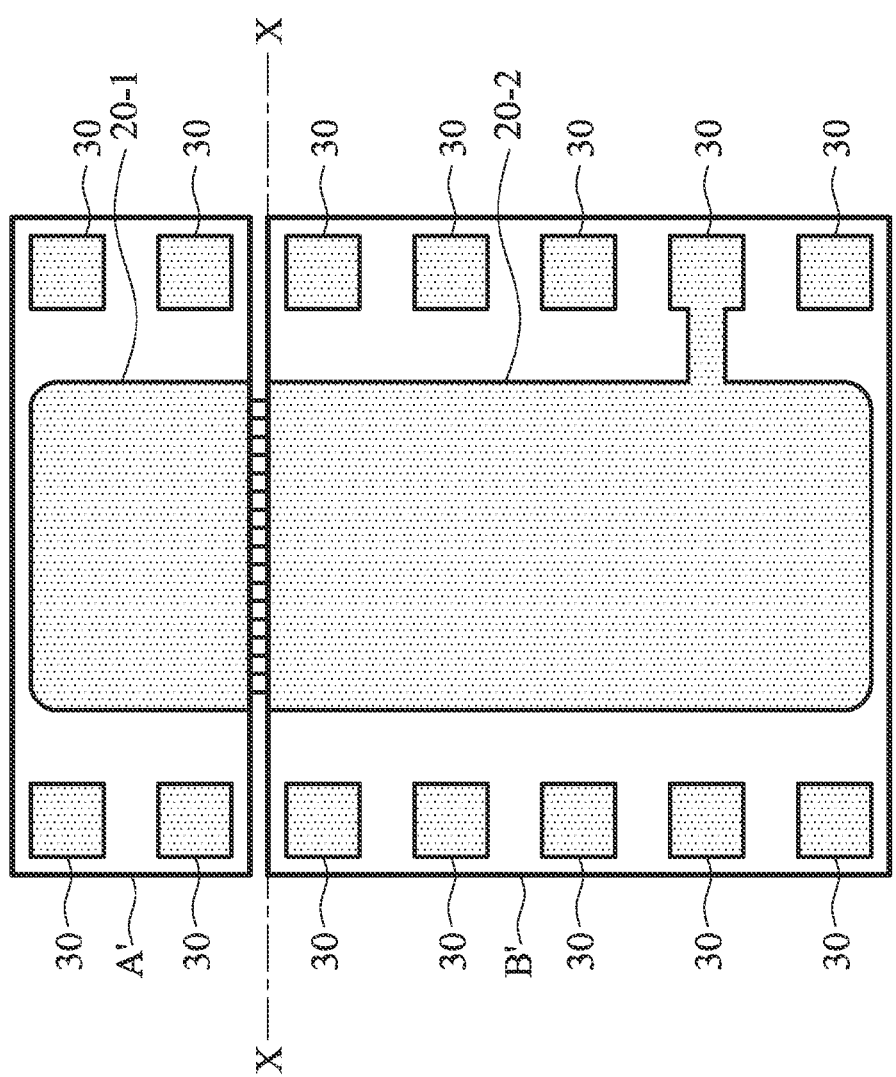
FIG. 3 shows another exemplary power amplifier footprint configured for flexibly mounting different types of power amplifiers thereon according to another embodiment of the invention.
Figure 4:
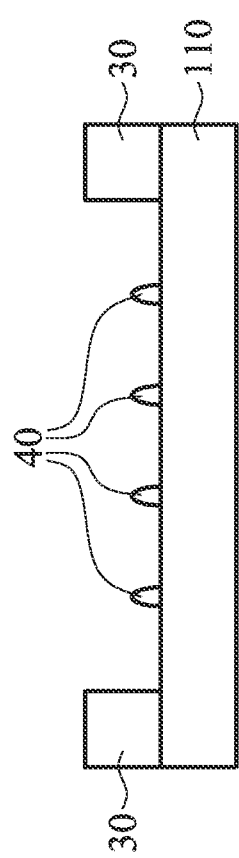
FIG. 4 shows a cross section view of the power amplifier footprint along the line X-X' according to an embodiment of the invention.

FIG. 3 shows another exemplary power amplifier footprint configured for flexibly mounting different types of power amplifiers thereon according to another embodiment of the invention. In the embodiment, the power amplifier footprint is separated into two parts, as the shown part A' and part B', and the ground plane 20-1 of part A' is separated from the ground plane 20-2 of part B'. Although the ground plane 20-1 of part A' is separated from the ground plane 20-2 of part B', in some embodiments of the invention, the ground plane 20-1 of part A' and the ground plane 20-2 of part B' are electrically connected to each other via one or more conductive lines. FIG. 4 shows a cross section view of the power amplifier footprint along the line X-X' according to an embodiment of the invention. As shown in FIG. 4, there are multiple conductive lines 40 mounted on the circuit board 101 for electrically connecting the ground plane 20-1 of part A' and the ground plane 20-2 of part B'. Note that the layout of the conductive lines may be flexibly designed. For example, the layout of the conductive lines may be designed as straight line as shown in FIG. 3, or as an X shape with one line crossing another, or others.

According to an embodiment of the invention, the I/O pads in part B or B' of the power amplifier footprint may at least comprise a first I/O pad configured for receiving the RF signals in a specific frequency band (for example, the low band) from the RF transceiver 220, a second I/O pad configured for outputting the amplified signals in the specific frequency band (for example, the low band amplified signals) to a following device, and the a third I/O pad configured for receiving an enable signal (for example, the low band enable signal LB_EN) for enabling the single band power amplifier or a portion of power amplifier circuit in the multi-band power amplifier mounted thereon. In addition, the I/O pads in part A or A' of the power amplifier footprint may at least comprise a fourth I/O pad configured for receiving the RF signals in another frequency band (for example, the high band) from the RF transceiver 220, a fifth I/O pad configured for outputting the amplified signals in the frequency band (for example, the high band amplified signals) to a following device, and a sixth I/O pad configured for receiving another enable signal (for example, the high band enable signal HB_EN) for enabling another portion of the power amplifier circuit in the multi-band power amplifier mounted thereon.

Figure 6:
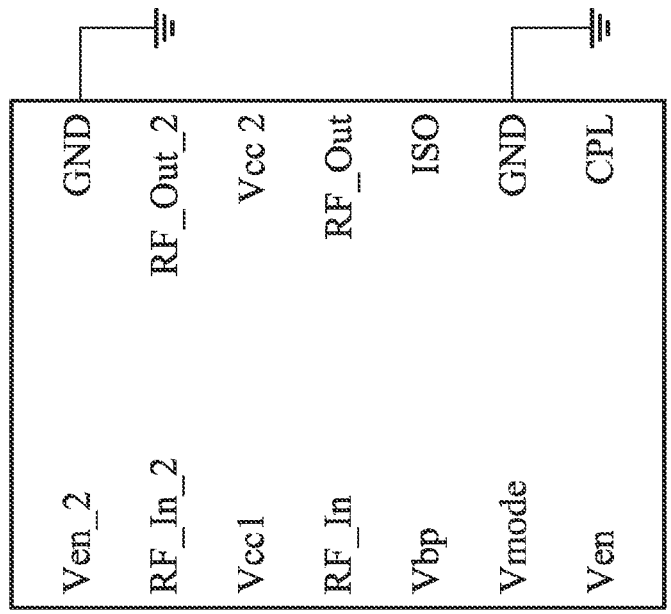
FIG. 6 shows an exemplary pin arrangement of a multi-band power amplifier suitable for being mounted on the power amplifier footprint as shown in FIG. 2 and FIG. 3 according to another embodiment of the invention.
Figure 5:
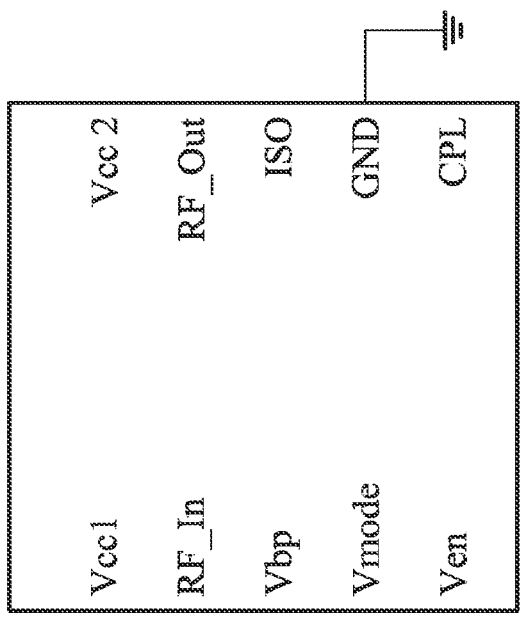
FIG. 5 shows an exemplary pin arrangement of a single band power amplifier suitable for being mounted on the power amplifier footprint as shown in FIG. 2 and FIG. 3 according to an embodiment of the invention.

FIG. 5 shows an exemplary pin arrangement of a single band power amplifier suitable for being mounted on the power amplifier footprint as shown in FIG. 2 and FIG. 3 according to an embodiment of the invention. Note that when being mounted, each pin as shown in FIG. 5 may be coupled to one I/O pad of the power amplifier footprint. The Vcc1 and Vcc2 pins are arranged to connect to the power supply voltage. The RF_In pin is arranged to receive the RF signals in a specific frequency band from the RF transceiver 220. The RF_Out pin is arranged to output the amplified signals. The Vbp and Vmode pins are arranged to receive the gain control signals for controlling the gains of the power amplifier. The ISO and CPL pins are arranged to form the coupling paths. The GND pin is arranged to be connected to the ground plane. The Ven pin is arranged to receive the enable signal (for example, the low band enable signal LB_EN) for enabling the single band power amplifier. FIG. 6 shows an exemplary pin arrangement of a multi-band power amplifier suitable for being mounted on the power amplifier footprint as shown in FIG. 2 and FIG. 3 according to another embodiment of the invention. Most of the pin arrangements are the same as the single band power amplifier. Note that the Ven pin of the multi-band power amplifier is arranged to receive the enable signal (for example, the low band enable signal LB_EN) for enabling a portion (i.e. the low band portion) of the power amplifier circuit in the multi-band power amplifier. In addition, the RF_In_2 pin is arranged to receive the RF signals in another frequency band from the RF transceiver 220. The RF_Out_2 pin is arranged to output the amplified signals. The Ven_2 pin is arranged to receive another enable signal (for example, the high band enable signal HB_EN) for enabling another portion (i.e. the high band portion) of the multi-band power amplifier circuit in the multi-band power amplifier.

As previously described, in order to be capable of supporting multi-band operations, the amount of switches and duplexers mounted on the circuit board may be flexibly increased or decreased according to the product requirements. Take the structure shown in FIG. 1 as an example, the electronic device 100 may support at most 4 UMTS bands. Therefore, when manufacturing, there may be at most two switch footprints and four duplexer footprints disposed on the circuit board 110 so as to reserve the area for mounting the corresponding switches and duplexers when required. For example, in the embodiment as shown in FIG. 1, the circuit board 110 may comprise a switch footprint disposed on the circuit board 110 in the low band signal processing branch and configured for mounting a switch (for example, the switch 280) thereon. When the switch 280 and a single band power amplifier are mounted on the circuit board 110, the switch 280 may be coupled to the single band power amplifier via at least one trace for receiving amplified low band RF signals from the single band power amplifier. On the other hand, when the switch 280 and a multi-band power amplifier are mounted on the circuit board 110, the switch 280 may be coupled to the multi-band power amplifier via at least one trace for receiving the amplified low band RF signals from the multi-band power amplifier. Those skilled in the art will appreciate that with relevant modification to the structure shown in FIG. 1 are there more than 4 UMTS bands can be supported. The invention should not be limited to a specific amount of UMTS bands can be supported.

The circuit board 110 may further comprise another switch footprint disposed on the circuit board 110 in the high band signal processing branch and configured for mounting another switch (for example, the switch 260) thereon. When the switch 260 and a multi-band power amplifier are mounted on the circuit board 110, the switch 260 may be coupled to the multi-band power amplifier via at least one trace for receiving the amplified high band RF signals from the multi-band power amplifier. In addition to the switch footprints, in the embodiment as shown in FIG. 1, the circuit board 110 may further comprise a first duplexer footprint disposed on the circuit board 110 in the low band signal processing branch and configured for mounting a first duplexer (for example, the duplexer 340) thereon, a second duplexer footprint disposed on the circuit board 110 in the low band signal processing branch and configured for mounting a second duplexer (for example, the duplexer 360) thereon, a third duplexer footprint disposed on the circuit board 110 in the high band signal processing branch and configured for mounting a third duplexer (for example, the duplexer 300) thereon, and a fourth duplexer footprint disposed on the circuit board 110 in the high band signal processing branch and configured for mounting a fourth duplexer (for example, the duplexer 320) thereon.

Note that in order to be capable of supporting less than 4 UMTS bands, the circuit board 110 may further comprise a first bypass resistor footprint disposed between the power amplifier footprint and the first duplexer footprint and configured for mounting a first bypass resistor (for example, the resistor 400 as shown in FIG. 1) thereon when required, and/or a second bypass resistor footprint disposed between the power amplifier footprint and the third duplexer footprint and configured for mounting a second bypass resistor (for example, the resistor 420 as shown in FIG. 1) thereon when required.

For example, when only 3 UMTS bands are designed to be supported by the electronic device 100, there may be only 1 switch IC (for example, the switch 260) and 3 duplexer ICs (for example, the duplexers 300, 320 and 340) mounted on the circuit board 110. In order to bypass the switch footprint configured for mounting the switch 280, the resistor 420 may further be mounted on the corresponding resistor footprint to form a bypass path isolated from the switch footprint. In this manner, the amplified RF signals may be directly transmitted from the multi-band power amplifier IC to the duplexer IC via the bypass resistor 420. For another example, when only one UMTS band is designed to be supported by the electronic device 100, there may be only 1 duplexer IC (for example, the duplexer 300) mounted on the circuit board 110. In order to bypass the switch footprint configured for mounting the switch 260, the resistor 400 may further be mounted on the corresponding resistor footprint to form a bypass path isolated from the switch footprint. In this manner, the amplified RF signals may be directly transmitted from the single band power amplifier IC to the duplexer IC via the bypass resistor 400.

Figure 7:
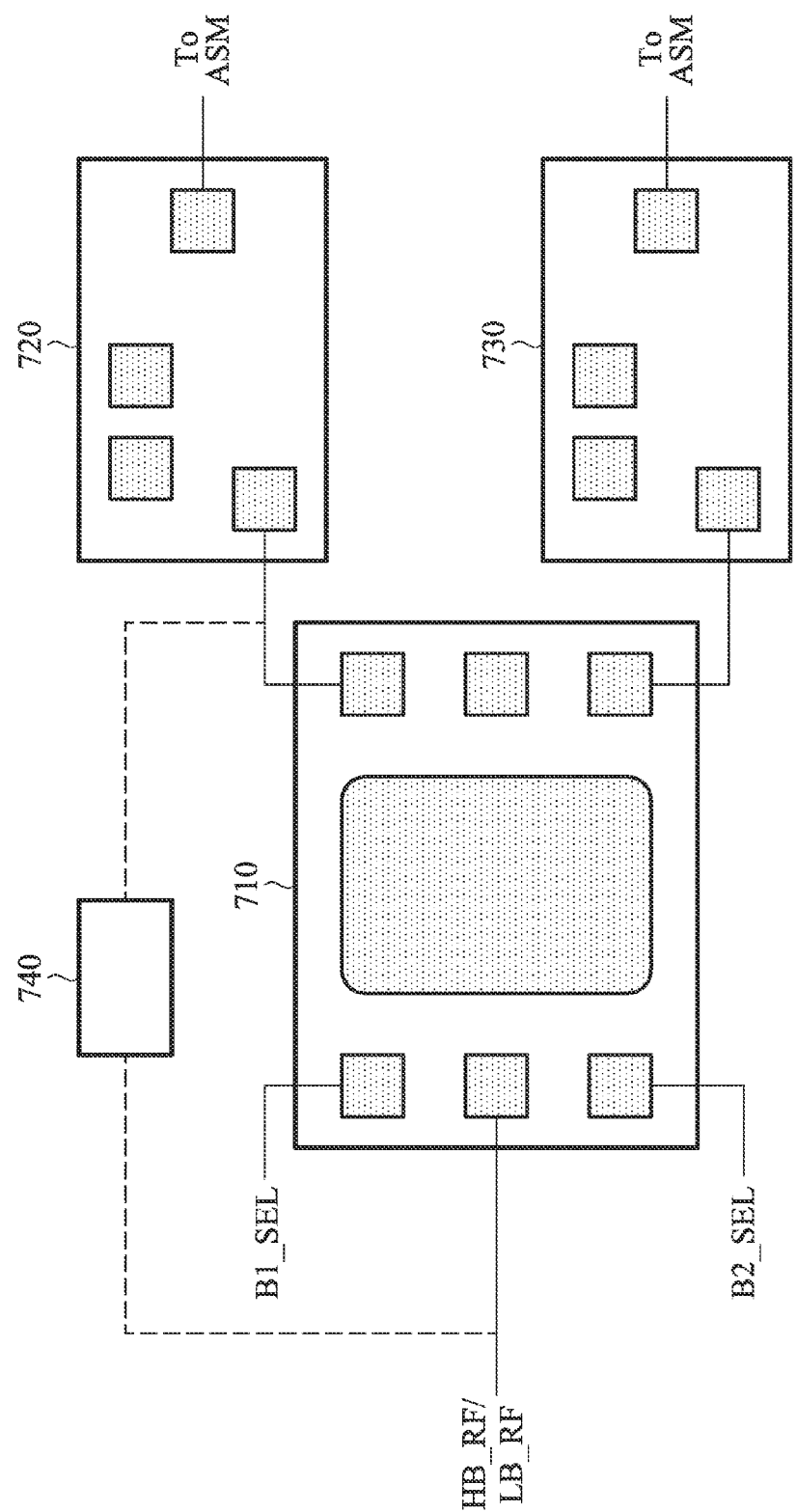
FIG. 7 is a schematic diagram showing a portion of layout of the electronic device according to an embodiment of the invention.

FIG. 7 is a schematic diagram showing a portion of layout of the electronic device according to an embodiment of the invention. To simplify the illustrations, only one switch footprint 710, one bypass resistor footprint 740 and two duplexer footprints 720 and 730 are shown. The switch mounted on the switch footprint 710 may receive the amplified high band or low band RF signals HB_RF/LB_RF from the single band or multi-band power amplifier via the trace coupled therebetween through the corresponding I/O pads. The switch mounted on the switch footprint 710 may further receive the band select signal B1_SEL and/or B2_SEL from the baseband processing device via the trace coupled therebetween through the corresponding I/O pads. The bypass resistor footprint 740 is disposed between the switch footprint 710 and the power amplifier footprint (not shown) and configured for mounting a bypass resistor thereon when required. The duplexer mounted on the duplexer footprint 720 may receive the high band or low band RF signals HB_RF/LB_RF for a specific UMTS band from the switch mounted on the switch footprint 710 via the trace coupled therebetween through the corresponding I/O pads. The duplexer mounted on the duplexer footprint 730 may receive the high band or low band RF signals HB_RF/LB_RF for another specific UMTS band from the switch mounted on the switch footprint 710 via the trace coupled therebetween through the corresponding I/O pads. The duplexer mounted on the duplexer footprint 720 and the duplexer mounted on the duplexer footprint 730 may further pass the high band or low band RF signals HB_RF/LB_RF to the ASM via the trace coupled therebetween through the corresponding I/O pads. Note that there may further be some matching elements disposed on the traces.

Conventionally, in order to fulfill a variety of system requirements in different countries or regions, the mobile phone manufacturer may design a specific PCB layout for each country or region, leading to increased design cost. To address the drawback described above, the mobile phone manufacturer may design a common PCB layout to reserve a large space for a maximum number of single-band power amplifier footprints capable of supporting any combinations of possible UMTS bands. However, it would waste much space when supported UMTS bands in a country or region are few. For example, when the common PCB layout reserves 4 single-band power amplifier footprints and the electronic device only needs to support one UMTS band in a country, it wastes at least three single-band power amplifier areas. Based on the invention concept, since the power amplifier footprints as shown in FIG. 2 and FIG. 3 are co-layout footprints, which can flexibly mount different types of power amplifiers thereon depending on product requirements, the circuit board area is much smaller than the conventional common PCB layout design. With previously described layout, by simply decreasing or increasing the amount of switches (and the corresponding switch footprints), duplexers (and the corresponding duplexer footprints), band select signals, band enable signals and/or the amount of signal processing branches, the electronic device may further be designed to be capable of supporting less than 4 or more than 4 UMTS bands. Note that the structure shown in FIG. 1 is merely an embodiment to clearly illustrate the concept of the invention, and the invention should not be limited thereto.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An electronic device, comprising:
   a circuit board, comprising a power amplifier footprint configured for mounting only one of a first power amplifier and a second power amplifier thereon, wherein the power amplifier footprint comprises:
   a first part, comprising a plurality of first I/O pads, wherein when the first power amplifier is mounted on the circuit board, only the first I/O pads in the first part are directly coupled to the first power amplifier; and
   a second part, comprising a plurality of second I/O pads, wherein when the second power amplifier is mounted on the circuit board, both the first I/O pads in the first part and the second I/O pads in the second part are directly coupled to the second power amplifier.

2. The electronic device as claimed in claim 1, wherein the first part further comprises a ground plane and the second part further comprises a ground plane, and the ground plane of the first part is separated from the ground plane of the second part.

3. The electronic device as claimed in claim 2, wherein the ground plane of the first part and the ground plane of the second part are electrically connected to each other via one or more conductive lines.

4. The electronic device as claimed in claim 1, further comprising:
   a first signal processing branch, for processing a plurality of first amplified signals in a first frequency band; and
   a second signal processing branch, for processing a plurality of second amplified signals in a second frequency band,
   wherein the second frequency band is higher than the first frequency band.

5. The electronic device as claimed in claim 1, wherein the circuit board further comprises:
   a first switch footprint, disposed on the circuit board in a first signal processing branch and configured for mounting a first switch thereon, wherein when the first switch and the first power amplifier are mounted on the circuit board, the first switch is coupled to the first power amplifier via at least one trace for receiving a plurality of first amplified signals in a first frequency band from the first power amplifier and when the first switch and the second power amplifier are mounted on the circuit board, the first switch is coupled to the second power amplifier via at least one trace for receiving the first amplified signals from the second power amplifier;
   a first duplexer footprint, disposed on the circuit board in the first signal processing branch and configured for mounting a first duplexer thereon, wherein when the first switch and the first duplexer are mounted on the circuit board, the first duplexer is coupled to the first switch via at least one trace for receiving the first amplified signals from the first switch; and
   a second duplexer footprint, disposed on the circuit board in the first signal processing branch and configured for mounting a second duplexer thereon, wherein when the first switch and the second duplexer are mounted on the circuit board, the second duplexer is coupled to the first switch via at least one trace for receiving the first amplified signals from the first switch.

6. The electronic device as claimed in claim 5, wherein the first switch selectively passes the first amplified signals to the first duplexer or the second duplexer in response to at least a first band select signal.

7. The electronic device as claimed in claim 5, wherein the circuit board further comprises a first bypass resistor footprint disposed between the power amplifier footprint and the first duplexer footprint and configured for mounting a first bypass resistor thereon, and when the first bypass resistor is mounted on the circuit board, the first amplified signals are directly transmitted from the first or second power amplifier to the first duplexer via the first bypass resistor.

8. The electronic device as claimed in claim 5, wherein the circuit board further comprises:
   a second switch footprint, disposed on the circuit board in a second signal processing branch and configured for mounting a second switch thereon, wherein when the second switch and the second power amplifier are mounted on the circuit board, the second switch is coupled to the second power amplifier via at least one trace for receiving a plurality of second amplified signals in a second frequency band from the second power amplifier;
   a third duplexer footprint, disposed on the circuit board in the second signal processing branch and configured for mounting a third duplexer thereon, wherein when the second switch and the third duplexer are mounted on the circuit board, the third duplexer is coupled to the second switch via at least one trace for receiving the second amplified signals from the second switch; and
   a fourth duplexer footprint, disposed on the circuit board in the second signal processing branch and configured for mounting a fourth duplexer thereon, wherein when the second switch and the fourth duplexer are mounted on the circuit board, the fourth duplexer is coupled to the second switch via at least one trace for receiving the second amplified signals from the second switch.

9. The electronic device as claimed in claim 8, wherein the second frequency band is higher than the first frequency band.

10. The electronic device as claimed in claim 8, wherein the second switch selectively passes the second amplified signals to the third duplexer or the fourth duplexer in response to at least a second band select signal.

11. The electronic device as claimed in claim 8, wherein the circuit board further comprises a second bypass resistor footprint disposed between the power amplifier footprint and the third duplexer footprint and configured for mounting a second bypass resistor thereon, and when the second bypass resistor is mounted on the circuit board, the second amplified signals are directly transmitted from the second power amplifier to the third duplexer via the second bypass resistor.

12. The electronic device as claimed in claim 1, wherein the plurality of first I/O pads in the first part of the power amplifier footprint at least comprises: a first I/O pad, configured for receiving a plurality of first radio frequency signals in a first frequency band; a second I/O pad, configured for outputting a plurality of first amplified signals in the first frequency band; and a third I/O pad, configured for receiving a first enable signal for enabling a portion of power amplifier circuit in the first or second power amplifier.

13. The electronic device as claimed in claim 12, wherein the plurality of second I/O pads in the second part of the power amplifier footprint at least comprises: a fourth I/O pad, configured for receiving a plurality of second radio frequency signals in a second frequency band, wherein the second frequency band is higher than the first frequency band; a fifth I/O pad, configured for outputting a plurality of second amplified signals in the second frequency band; and a sixth I/O pad, configured for receiving a second enable signal for enabling another portion of power amplifier circuit in the second power amplifier.

14. The electronic device as claimed in claim 1, wherein the first power amplifier is a single band power amplifier integrated circuit (IC) and the second power amplifier is a multi-band power amplifier IC.

15. The electronic device as claimed in claim 13, wherein the first frequency band at least comprises UMTS (Universal Mobile Telecommunications System) Band V and Band VIII, and the second frequency band at least comprises UMTS Band I, Band II and Band IV.

* * * * *